May 19, 1970 L. E. CLARK 3,513,366

HIGH VOLTAGE SCHOTTKY BARRIER DIODE

Filed Aug. 21, 1968

INVENTOR.
Lowell E. Clark

BY
Mueller, Aichele, & Rauner
Attys'

United States Patent Office 3,513,366
Patented May 19, 1970

3,513,366

HIGH VOLTAGE SCHOTTKY BARRIER DIODE

Lowell E. Clark, Phoenix, Ariz., assignor to Motorola, Inc., Franklin Park, Ill., a corporation of Illinois Filed Aug. 21, 1968, Ser. No. 754,325
Int. Cl. H01l 9/12
U.S. Cl. 317—235 10 Claims

ABSTRACT OF THE DISCLOSURE

In the fabrication of a passivated surface barrier (Schottky) diode wherein the breakdown voltage is improved by the use of an annular region of P-type conductivity at the periphery of the metal barrier, carrier injection from the P-type region is suppressed by the use of a double-diffusion technique whereby an N+ region is formed within the P-type ring. Alignment of the Schottky barrier electrode with the diffused annular region is thereby rendered essentially non-critical since the close proximity of the two PN junctions formed by the double-diffusion technique sharply increases the resistance to current flow from the metal barrier to the P-type ring.

BACKGROUND

This invention relates to the fabrication of a surface barrier diode, also known as a "hot carrier" diode or a Schottky diode. More particularly, the invention relates to the improvement of a passivated surface barrier diode wherein the breakdown voltage is increased by the use of a peripheral PN junction; and specifically to means for suppressing the injection of carriers across such a junction.

Recent improvements in the design and manufacture of surface barrier diodes have included the fabrication of oxide-passivated devices in which the breakdown voltage is sharply increased by the selective diffusion of a P-type region surrounding the periphery of the metal barrier electrode. Such devices are characterized by an extremely short reverse recovery time due to the lack of a measurable minority-carrier charge.

One disadvantage of such a design is the need for critically precise alignment of the periphery of the metal barrier with the PN junction formed by the diffused ring. That is, if the PN junction is contacted by the barrier electrode, the application of a forward bias will cause the injection of carriers from the ring into the Schottky barrier region thereby increasing the recovery time. On the other hand, if the PN junction is separated from the Schottky barrier, leakage in the reverse direction may be appreciable before the depletion of region reaches the peripheral PN junction. Therefore, an optimum device can result only from an exact registry of the electrode periphery with the PN junction.

THE INVENTION

It is an object of the invention to improve the construction of a surface barrier diode of the passivated type and more particularly to suppress the injection of carriers across the peripheral PN junction provided to increase breakdown voltage. It is a further object of the invention to minimize the need for precision in the alignment of the barrier electrode with the peripheral PN junction.

A primary feature of the Schottky barrier diode of the invention lies in the construction of a passivated structure wherein the Schottky barrier region of the semiconductor body is surrounded by a region of opposite conductivity type within which is located a region of the same conductivity type, closely spaced from the inner periphery of the region of opposite conductivity type. Both of such regions surround the Schottky barrier region and extend to the surface of the semiconductor body, thereby forming two closely spaced PN junctions which extend to the surface of the semiconductor body near the periphery of the barrier electrode.

It is essential that the contact portion of the barrier electrode extend outwardly from the center of the Schottky barrier region of the semiconductor body at least approximately as far as the first of the PN junctions surrounding the Schottky barrier region; it is also essential that the periphery of the barrier electrode does not fall beyond the region located within said region of opposite conductivity type.

The invention is embodided in a surface barirer diode comprising a semiconductor body having a first region therein of one conductivity type extending to a first area of a surface of the semiconductor body. A second region within said body, of opposite conductivity type, extends to a second area of the semiconductor surface, surrounding the first area. A third region within said body, of said one conductivity type, extends to a third area of the semiconductor surface surrounding the first and second areas. The distance separating the first and third areas is usually less than 1.5 microns. A surface barrier electrode is located on the semiconductor surface in contact with the first, second and third area.

In a specific embodiment, the diode of the invention includes a Schottky semiconductor region of N-type conductivity surrounded laterally by a semiconductor region of P-type conductivity wherein a semiconductor region of N-type conductivity is located, the inner periphery of which is closely sepaced from the inner periphery of said P-type region. The periphery of a metal barrier electrode contacting the Schottky semiconductor region lies beyond the inner periphery of the P-type region and beyond the inner periphery of the N-type region within said P-type region; but does not contact the outer periphery of the N-type region within the P-type region. Any portion of the metal electrode which extends beyond its periphery of contact with the semiconductor body is separated therefrom by means of an oxide passivation layer or other insulation film.

The invention is also embodied in a method for the fabrication of a surface barrier diode, beginning with the step of providing a semiconductor body of one conductivity type having a resistivity of at least 0.2 ohm-centimeter. A first dopant is then selectively diffused into a surface of the semiconductor to form a region of opposite conductivity type patterned to surround a portion of the substrate surface. A second dopant is then selectively diffused into the substrate surface to form a region of said one conductivity type within said region of opposite conductivity type. The two diffused regions surround substantially the same area of the surface of the substrate, such that the inner periphery of the second diffused region is preferably spaced from the inner periphery of the first diffused region by a distance no greater than is required to avoid punch-through of one PN junction with respect to the other. Generally, such distance is no more than about 1.5 microns. A surface barrier metal electrode is then deposited on that portion of the semiconductor surface surrounded by said first diffused region, while limiting the outer periphery of the electrode contact area within the outer periphery of the second diffused region.

THE DRAWING

Figure 1:
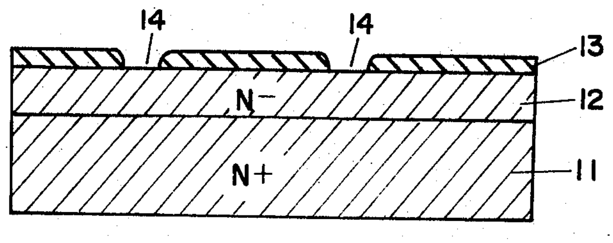
FIGS. 1–3 are greatly enlarged cross-sectional views illustrating various intermediate stages in the fabrication of an embodiment of the invention.

FIG. 1 silicon substrate 11 of N-type conductivity is provided, having a resistivity no greater than $10^{-3}$ ohm-centimeter. Epitaxial layer 12 is deposited on substrate 11, using known techniques, to provide a layer of about 2 to 5 microns thickness and having a resistivity of about 0.5 to 2.0 ohm-centimeters. An oxide layer 13, or other dielectric film, is deposited on epitaxial layer 12 and is patterned to provide an annular window 14 in preparation for a selective diffusion step in which layer 13 serves as the diffusion mask.

Figure 2:
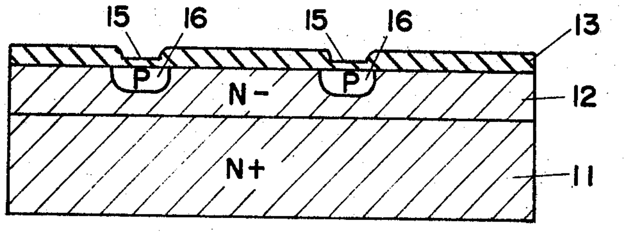

FIG. 2 illustrates the structure of FIG. 1 after the selective diffusion of an acceptor dopant, preferably boron, to provide annular diffused region 16 or P-type conductivity. During the diffusion step a thin oxide layer 15 forms within window 14.

Figure 3:
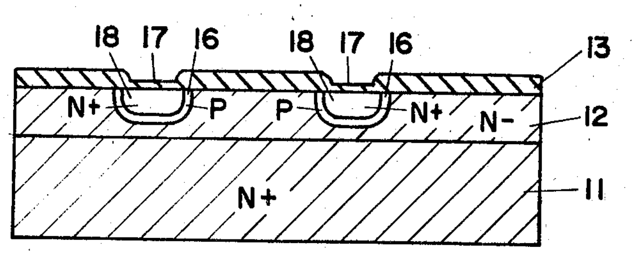

FIG. 3 illustrates the structure of FIG. 2 after the reopening of window 14 by selective etching to remove oxide layer 15, followed by the selective diffusion of a donor dopant through the reopened window, thereby forming a diffused region 18 of N-type conductivity. Simultaneously with the formation of region 18, the dopant of region 16 diffuses farther into layer 12, thereby enlarging region 16.

Although the resistivities of regions 16 and 18 are not critical, it is preferred to introduce a surface impurity concentration about $10^{16}$ atoms per cc. when diffusing region 16, and thereafter to provide a surface impurity concentration of at least $10^{17}$ atoms per cc. when diffusing region 18. The preferred dopant used in forming region 18 is phosphorous. A thin oxide layer 17 is formed during such diffusion.

Figure 4:
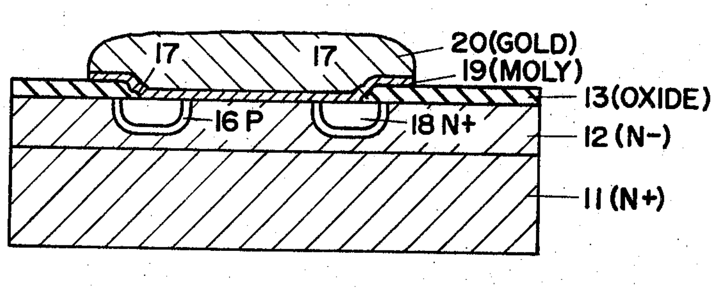
FIG. 4 is a greatly enlarged cross-sectional view of a structure completed in accordance with an embodiment of the invention.

In order to complete the structure, as illustrated in FIG. 4, the structure of FIG. 3 is first modified by selectively removing that portion of oxide layer 13 surrounded by oxide layer 17. When removing such portion of oxide layer 13, about one-half of oxide layer 17 is also removed, thereby preparing the structure for the deposition of the barrier metal. Great precision is not required in the oxide removal step, since the entire width of region 18 is provided as a "margin for error." That is, the periphery of metal barrier 19 is located anywhere between the inner and outer surface boundaries of region 18. Molybdenum film 19 or other suitable metal is then deposited to form the metal-semiconductor interface or Schottky barrier, follower by the deposition of gold contact 20, or other suitable metal to complete the structure.

Since diffused region 18 is formed to limit the flow of current between barrier electrode 19 and region 16, it will be apparent that a preferred embodiment of the invention comprises a structure wherein the PN junction formed between region 16 and region 18 is as close as possible to the PN junction formed between region 16 and layer 12, consistent with an avoidance of punch-through of one junction with respect to the other. Current technology is capable of forming two such junctions separated by a distance of down to about 0.5 micron, provided both junctions are shallow. In a larger device, requiring deeper junctions, somewhat wider spacing is necessary. Nevertheless, a substantial benefit is also obtained by the formation of a relatively small region 18 within a relatively large region 16, provided only that some portion of region 18 lies between region 16 and the barrier electrode, whereby the leakage of current through region 16 is suppressed.

In addition to the reduction of the area of contact between the barrier electrode and region 16, the invention further reduces current leakage by limiting such contact to that portion of region 16 which inherently has the highest resistivity, due to the normal impurity concentration profile that exists in a diffused region.

Without the improvement of the invention, a surface barrier diode having a peripheral PN junction is known to suffer as much as 50% leakage of current through the junction, under conditions approaching maximum bias. With the present invention it is easily practical to reduce the barrier electrode contact area and resistivity of region 16 sufficiently to provide a device wherein less than 5% of the current flow passes through the peripheral PN junction, even when approaching maximum operating bias voltage.

A further improvement in the device of the invention results from the use of an additional band of metallization, surrounding the surface barrier electrode and contacting layer 12 through an annular window in the passivation layer. The function of such metallization is to interrupt any surface-induced inversion layer that may develop within layer 12 near the interface with passivation layer 13.

It will be apparent that the invention also includes the device that would result from a reversal of all conductivity types, compared to the device shown in FIG. 4 of the drawings.

I claim:

1. A surface barrier diode comprising:

(a) a semiconductor body having a first region therein of one conductivity type including a first area of a surface of said body;

(b) a second region of opposite conductivity type within said body including a second area of said surface surrounding said first area;

(c) a third region of said one conductivity type within said body including a third area of said surface surrounding said first and second area, said first and third regions being separated from each other by said second region; and (d) a surface barrier electrode on said surface in contact with said first, second and third areas.

2. A surface barrier diode as defined by claim 1 wherein said second region has an annular geometry, forming with said first region a first PN junction that extends to said semiconductor surface along a first pair of substantially concentric, closed curves; wherein said third region also has an annular geometry, forming with said second region a second PN junction that extends to said semiconductor surface along a second pair of substantially concentric, closed curves intermediate said first pair of closed curves; and wherein the periphery of contact of said surface barrier electrode with said semiconductor surface is located intermediate said second pair of closed curves.

3. A diode as defined by claim 1 wherein said first region comprises a silicon layer of N-type conductivity having a resistivity of 0.2 to 2.0 ohm-centimeters.

4. A diode as defined by claim 1 wherein said semiconductor body is silicon, said first and third regions have N-type conductivity, and said barrier electrode is molybdenum.

5. A diode as defined by claim 1 wherein the distance separating said first and third areas is less than 1.5 microns.

6. A method for the fabrication of a surface barrier diode comprising:

(a) providing a semiconductor body of one conductivity type having a resistivity of at least 0.2 ohm-centimeter;

(b) selectively diffusing a dopant into a surface of said body to form a first region of opposite conductivity type patterned to surround a portion of the surface of said body;

(c) selectively diffusing a dopant of the said one conductivity type into said first region to form a second region within said first region surrounding substantially the same area of said surface as surrounded by said first region of opposite conductivity type; and (d) depositing a surface barrier electrode on that portion of said semiconductor surface surrounded by said diffused regions, while limiting the outer periphery of the electrode contact area within the outer periphery of the pattern of the second diffusion.

7. A method as defined by claim 6 wherein said semiconductor body is N-type silicon, the first dopant is boron, the second dopant is phosphorus, and the barrier electrode is molybdenum.

8. A method as defined by claim 7 wherein the surface concentration of boron is at least about $10^{16}$ atoms/cc. and that of the phosphorus is at least about $10^{17}$ atoms/cc.

9. A method as defined by claim 6 wherein the inner periphery of said second region is spaced from the inner periphery of said first region by no more than 1.5 microns.

10. A method as defined by claim 6 wherein step (c) is controlled to provide a PN junction spaced as closely as possible to the PN junction formed by the dopant of step (b), consistent with device reliability and avoidance of punch-through.

References Cited

UNITED STATES PATENTS 3,463,971 8/1969 Soshea ------------- 317—234

JOHN W. HUCKERT, Primary Examiner

M. H. EDLOW, Assistant Examiner

U.S. Cl. X.R.

317—234